US012563764B2

(12) United States Patent　　　(10) Patent No.:　US 12,563,764 B2
Hou　　　　　　　　　　　　　　　　　　(45) Date of Patent:　　　Feb. 24, 2026

(54) COMPLEMENTARY HIGH ELECTRON MOBILITY TRANSISTOR

(71) Applicant: UNITED MICROELECTRONICS CORP., Hsin-Chu (TW)

(72) Inventor: Hsin-Ming Hou, Tainan (TW)

(73) Assignee: UNITED MICROELECTRONICS CORP., Hsin-Chu (TW)

( * ) Notice:　Subject to any disclaimer, the term of this patent is extended or adjusted under 35 U.S.C. 154(b) by 515 days.

(21) Appl. No.: 17/577,042

(22) Filed:　　Jan. 17, 2022

(65)　　　　　Prior Publication Data

US 2023/0207679 A1　　　Jun. 29, 2023

(30)　　　Foreign Application Priority Data

Dec. 23, 2021　　(CN) ......................... 202111587039.4

(51) Int. Cl.
　　*H10D 30/47*　　　(2025.01)
　　*H10D 62/85*　　　(2025.01)
(52) U.S. Cl.
　　CPC ..... *H10D 30/4755* (2025.01); *H10D 62/8503* (2025.01)
(58) Field of Classification Search
　　CPC ............. H01L 29/7787; H01L 29/2003; H01L 27/085; H10D 62/8503; H10D 30/4755
　　See application file for complete search history.

(56)　　　　　　References Cited

U.S. PATENT DOCUMENTS

| | | | | |
|---|---|---|---|---|
| 4,830,980 | A | * | 5/1989 | Hsieh .................. H01L 21/8252 |
| | | | | 257/283 |
| 9,018,056 | B2 | | 4/2015 | Kub |
| 9,559,012 | B1 | | 1/2017 | Chu |
| 2010/0270591 | A1 | * | 10/2010 | Ahn ..................... H01L 29/7782 |
| | | | | 257/E21.403 |

(Continued)

FOREIGN PATENT DOCUMENTS

TW　　　　201411838 A　　　3/2014

OTHER PUBLICATIONS

Chang, AlGaN/GaN Modulation-Doped Field-Effect Transistors with An Mg-doped Carrier Confinement Layer, 2003 (Year: 2003).*

(Continued)

*Primary Examiner* — Britt Hanley
*Assistant Examiner* — Casey Paul Boatman
(74) *Attorney, Agent, or Firm* — Winston Hsu

(57)　　　　　　ABSTRACT

A complementary high electron mobility transistor includes an N-type HEMT and an P-type HEMT disposed on the substrate. The N-type HEMT includes a first undoped gallium nitride layer, a first quantum confinement channel, a first undoped group III-V nitride compound layer and an N-type group III-V nitride compound layer disposed from bottom to top. A first gate is disposed on the N-type group III-V nitride compound layer. A first source and a first drain are disposed at two sides of the first gate. The P-type HEMT includes a second undoped gallium nitride layer, a second quantum confinement channel, a second undoped group (Continued)

III-V nitride compound layer and a P-type group III-V nitride compound layer disposed from bottom to top. A second gate is disposed on the P-type group III-V nitride compound layer. A second source and a second drain are disposed at two sides of the second gate.

15 Claims, 4 Drawing Sheets

(56) References Cited

U.S. PATENT DOCUMENTS

2018/0145163 A1* 5/2018 Teo ........................ H01L 29/205

OTHER PUBLICATIONS

Chen, Influence of traps on the gate reverse characteristics of normally-off high-electron-mobility transistors with regrown p-GaN gate, 2021 (Year: 2021).*
Hamady, P-doped region below the AlGaN/GaN interface for a normally-off HEMT, 2015 (Year: 2015).*
Rongming Chu ,An Experimental Demonstration of GaN CMOS Technology, IEEE Electron Device Letters, vol. 37, No. 3, Mar. 2016.

* cited by examiner

COMPLEMENTARY HIGH ELECTRON MOBILITY TRANSISTOR

BACKGROUND OF THE INVENTION

1. Field of the Invention

The present invention relates to a complementary high electron mobility transistor (HEMT) which includes gallium indium nitride, and more particular to a complementary HEMT which is formed by an aluminum gallium nitride/indium gallium nitride/gallium nitride stack.

2. Description of the Prior Art

Due to their semiconductor characteristics, III-V semiconductor compounds may be applied in many kinds of integrated circuit devices, such as high power field effect transistors, high frequency transistors, or HEMTs. In the high electron mobility transistor, two semiconductor materials with different band-gaps are combined and a heterojunction is formed at the junction between the semiconductor materials as a channel for carriers. In recent years, gallium nitride (GaN) based materials have been applied in high power and high frequency products because of their properties of wider band-gap and high saturation velocity.

A two-dimensional electron gas (2DEG) may be generated by the piezoelectric property of the GaN-based materials, and the switching velocity may be enhanced because of the higher electron velocity and the higher electron density of the 2DEG.

However, a P-type HEMT is needed to work with an N-type HEMT to form a complementary HEMT with high efficiency.

SUMMARY OF THE INVENTION

In light of the above, a complementary HEMT which is formed by an aluminum gallium nitride/indium gallium nitride/gallium nitride stack is provided in the present invention.

According to a preferred embodiment of the present invention, a complementary HEMT includes a substrate. An N-type HEMT is disposed on the substrate, wherein the N-type HEMT includes a first undoped gallium nitride layer, a first quantum confinement channel, a first undoped group III-V nitride compound layer and an N-type group III-V nitride compound layer disposed from bottom to top. A first gate is disposed on the N-type group III-V nitride compound layer. A first source and a first drain are disposed at two sides of the first gate. A P-type HEMT is disposed on the substrate. The P-type HEMT includes a second undoped gallium nitride layer, a second quantum confinement channel, a second undoped group III-V nitride compound layer and a P-type group III-V nitride compound layer disposed from bottom to top. A second gate is disposed on the P-type group III-V nitride compound layer. A second source and a second drain are disposed at two sides of the second gate.

According to another preferred embodiment of the present invention, a complementary HEMT includes a substrate. An N-type HEMT is disposed on the substrate. The N-type HEMT includes a P-type gallium nitride layer, a first quantum confinement channel, a first undoped group III-V nitride compound layer and an N-type group III-V nitride compound layer disposed from bottom to top. A first gate is disposed on the N-type group III-V nitride compound layer. A first source and a first drain are disposed at two sides of the first gate. A P-type HEMT is disposed on the substrate. The P-type HEMT includes an N-type gallium nitride layer, a second quantum confinement channel, a second undoped group III-V nitride compound layer and a P-type group III-V nitride compound layer disposed from bottom to top. A second gate is disposed on the P-type group III-V nitride compound layer. A second source and a second drain are disposed at two sides of the second gate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
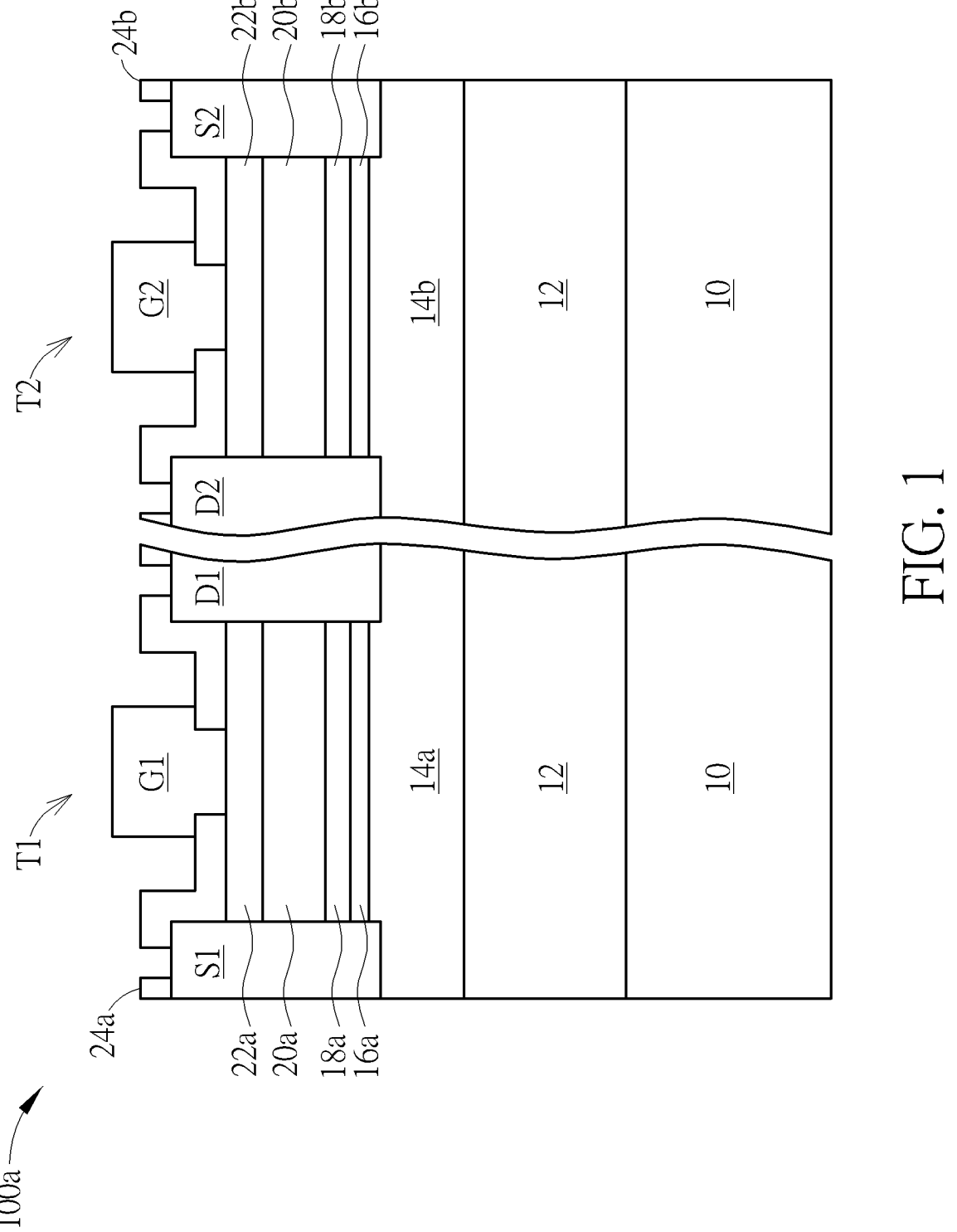
FIG. 1 depicts a complementary HEMT according to a first preferred embodiment of the present invention.

FIG. 1 depicts a complementary HEMT according to a first preferred embodiment of the present invention.

As shown in FIG. 1, a complementary HEMT 100a includes a substrate 10. The substrate 10 includes a buffer layer 12. The buffer layer 12 can optionally include a nucleation layer, a transition layer and a superlattice layer. The substrate 10 includes a silicon substrate, a silicon carbide substrate, a sapphire substrate, or a silicon on insulator substrate. An N-type HEMT T1 and a P-type HEMT T2 are disposed on the substrate 10. The N-type HEMT T1 includes a first undoped gallium nitride layer 14a, a first quantum confinement channel 16a, a first undoped group III-V nitride compound layer 18a and an N-type group III-V nitride compound layer 20a and a first group III-V nitride compound cap layer 22a disposed from bottom to top. The first quantum confinement channel 16a contacts the first undoped gallium nitride layer 14a. The first undoped group III-V nitride compound layer 18a contacts the first quantum confinement channel 16a. The N-type group III-V nitride compound layer 20a contacts the first undoped group III-V nitride compound layer 18a. The first group III-V nitride compound cap layer 22a contacts the N-type group III-V nitride compound layer 20a.

Moreover, a first gate G1 is disposed on the N-type group III-V nitride compound layer 20a. The first source S1 and the first drain D1 are disposed at two sides of the first gate G1. The first gate G1 contacts the first group III-V nitride compound cap layer 22a. The first source S1 and a first drain D1 respectively penetrate the first group III-V nitride compound cap layer 22a, the N-type group III-V nitride compound layer 20a, the first undoped group III-V nitride compound layer 18a and the first quantum confinement channel 16a, and contact the first undoped gallium nitride layer 14a.

On the other hand, the P-type HEMT T2 includes a second undoped gallium nitride layer 14b, a second quantum confinement channel 16b, a second undoped group III-V nitride compound layer 18b and a P-type group III-V nitride compound layer 20b and a second group III-V nitride compound cap layer 22b disposed from bottom to top. The second quantum confinement channel 16b contacts the second undoped gallium nitride layer 14b. The second undoped group III-V nitride compound layer 18b contacts the second quantum confinement channel 16b. The P-type group III-V nitride compound layer 20b contacts the second undoped group III-V nitride compound layer 18b. The second group III-V nitride compound cap layer 22b contacts the P-type group III-V nitride compound layer 20b.

Moreover, a second gate G2 is disposed on the P-type group III-V nitride compound layer 20b. The second source S2 and the second drain D2 are disposed at two sides of the second gate G2. The second gate G2 contacts the second group III-V nitride compound cap layer 22b. The second source S2 and the second drain D2 respectively penetrate the second group III-V nitride compound cap layer 22b, the P-type group III-V nitride compound layer 20b, the second undoped group III-V nitride compound layer 18b and the second quantum confinement channel 16b, and contact the second undoped gallium nitride layer 14b. A first protective layer 24a covers the first group III-V nitride compound cap layer 22a, and a second protective layer 24b covers the second group III-V nitride compound cap layer 22b.

According to a preferred embodiment of the present invention, the first quantum confinement channel 16a and the second quantum confinement channel 16b respectively include group III-V nitride compounds. In details, the first quantum confinement channel 16a and the second quantum confinement channel 16b respectively comprise undoped $In_xGa_{1-x}N$, and $x \le 1$. The X of the $In_xGa_{1-x}N$ in the first quantum confinement channel 16a and the X of the $In_xGa_{1-x}N$ in the second quantum confinement channel 16b can be the same or different. In order to make the fabricating process easier, the first quantum confinement channel 16a and the second quantum confinement channel 16b preferably consist the same materials. For example, the first quantum confinement channel 16a and the second quantum confinement channel 16b are both InN. The first quantum confinement channel 16a and the second quantum confinement channel 16b serve as paths of carriers. It is noted worthy that density and uniformity of two-dimensional electron gas (2DEG) of the N-type HEMT T1 can be increased by using $In_xGa_{1-x}N$ as the first quantum confinement channel 16a, and density and uniformity of two-dimensional hole gas (2DHG) of the P-type HEMT T2 can be increased by using $In_xGa_{1-x}N$ as the second quantum confinement channel 16b. Moreover, the thickness of the first quantum confinement channel 16a is between 10 and 100 angstroms. The thickness of the second quantum confinement channel 16b is between 10 and 100 angstroms.

The first undoped gallium nitride layer 14a is used to adjust the threshold voltage of the N-type HEMT T1. The second undoped gallium nitride layer 14b is used to adjust the threshold voltage of the P-type HEMT T2. In this embodiment, the first undoped gallium nitride layer 14a and the second undoped gallium nitride layer 14b are both formed by undoped GaN. Because the physical property of GaN, the N-type HEMT T1 and the P-type HEMT T2 are both normally—on transistors.

Furthermore, the first undoped group III-V nitride compound layer 18a and the second undoped group III-V nitride compound layer 18b respectively include undoped $Al_yGa_{1-y}N$, and $y \le 1$. In order to make the fabricating process easier, the first undoped group III-V nitride compound layer 18a and the second undoped group III-V nitride compound layer 18b preferably consist the same materials. For example, the first undoped group III-V nitride compound layer 18a and the second undoped group III-V nitride compound layer 18b are both AlN. The first undoped group III-V nitride compound layer 18a is used to prevent the N-type group III-V nitride compound layer 20a from influencing carriers within the first quantum confinement channel 16a and avoiding carriers from scattering. Similarly, the second undoped group III-V nitride compound layer 18b is used to prevent the P-type group III-V nitride compound layer 20b from influencing carriers within the second quantum confinement channel 16b and avoiding carriers from scattering.

The N-type group III-V nitride compound layer 20a preferably includes $Al_mGa_{1-m}N$, and $m \le 1$. According to a preferred embodiment of the present invention, m of the $Al_mGa_{1-m}N$ of the N-type group III-V nitride compound layer 20a decreases from bottom to top. That is, m is greater in the N-type group III-V nitride compound layer 20a nearer to the first undoped group III-V nitride compound layer 18a. For example, m of the N-type group III-V nitride compound layer 20a contacts the first undoped group III-V nitride compound layer 18a is 0.9. Therefore, the N-type group III-V nitride compound layer 20a is $Al_{0.9}Ga_{0.1}N$. On the other hand, m of the N-type group III-V nitride compound layer 20a contacts the first group III-V nitride compound cap layer 22a is 0.25. Therefore, the first undoped group III-V nitride compound layer 18a is $Al_{0.25}Ga_{0.75}N$. The P-type group III-V nitride compound layer 20b preferably includes $Al_nGa_{1-n}N$, and $n \le 1$. According to a preferred embodiment of the present invention, n of the $Al_nGa_{1-n}N$ of the P-type group III-V nitride compound layer 20b also decreases from bottom to top. According to one example of the present invention, in the same depth, n and m is not necessary to be the same.

In addition, N-type dopants in the N-type group III-V nitride compound layer 20a includes group IV elements such as C, Si or Ge. In this embodiment, the N-type dopants are preferably Si. P-type dopants in the P-type group III-V nitride compound layer 20b includes group II elements such as Mg, Ca, Sr. In this embodiment, the P-type dopants are preferably Mg.

The first source S1, the first drain D1, the first gate G1, the second source S2, the second drain D2 and the second gate G2 may respectively include metal-containing materials or other doped semiconductive materials. The metal-containing materials may be Au, W, Co, Ni, Ti, Mo, Cu, Al, Ta, Pd or chemical compounds, composite layers or alloys of the Au, W, Co, Ni, Ti, Mo, Cu, Al, Ta or Pd. The first group III-V nitride compound cap layer 22a and the second group III-V nitride compound cap layer 22b are preferably made of the same material. For example, the first group III-V nitride compound cap layer 22a and the second group III-V nitride compound cap layer 22b can be GaN. The first group III-V nitride compound cap layer 22a and the second group III-V nitride compound cap layer 22b are used to prevent the aluminum in the N-type group III-V nitride compound layer 20a and the P-type group III-V nitride compound layer 20b from oxidation. Moreover, the first protective layer 24a and the second protective layer 24b are preferably made of the same material such as silicon nitride or silicon oxide.

As shown in FIG. 1, a method of fabricating a complementary HEMT 100a includes providing a substrate 10. Next, a buffer layer 12 is formed to cover the substrate 10. Then, an epitaxial process is performed to simultaneously form a first undoped gallium nitride layer 14a and a second undoped gallium nitride layer 14b. After that, a first quantum confinement channel 16a and a second quantum confinement channel 16b are simultaneously formed. After that, a P-type group III-V nitride compound layer 20b is formed on the second undoped group III-V nitride compound layer 18b. Subsequently, an N-type group III-V nitride compound layer 20a is formed on the first undoped group III-V nitride compound layer 18a. The fabricating sequence of the P-type group III-V nitride compound layer 20b and the N-type group III-V nitride compound layer 20a can be exchanged with each other. Next, a first group III-V nitride compound cap layer 22a and a second group III-V nitride compound cap layer 22b are simultaneously formed. After that, a first source S1, a first drain D1, a second source S2 and a second drain D2 are simultaneously formed. Later, a first protective layer 24a and a second protective layer 24b are simultaneously formed. Finally, a first gate G1 and a second gate G2 are simultaneously formed. Now, the complementary HEMT 100a in the first preferred embodiment is completed. In the fabricating process mentioned above, the elements which formed simultaneously are made of the same material and are formed within the same chamber by the same process.

Figure 2:
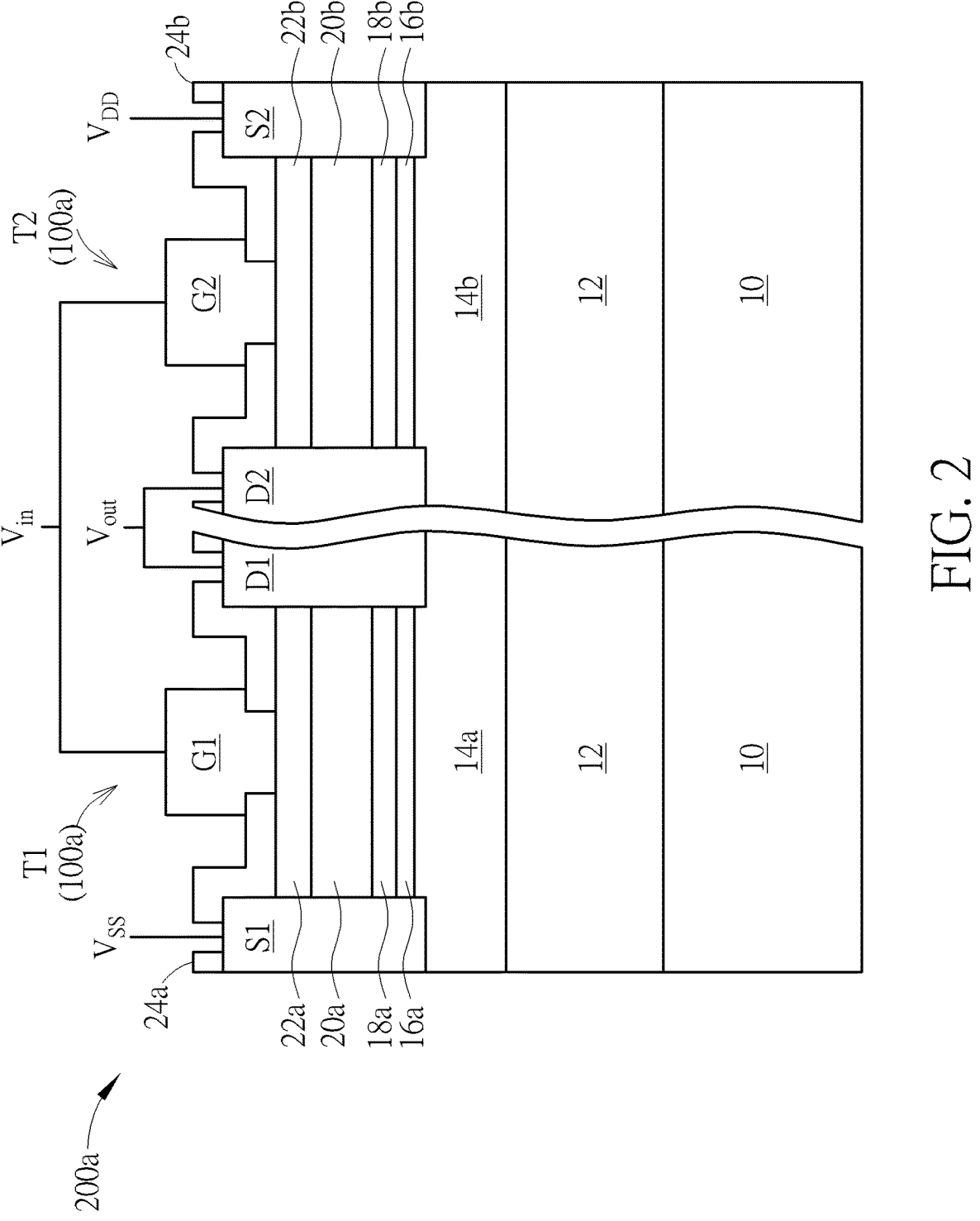
FIG. 2 depicts an inverter formed by a complementary HEMT disclosed in the first preferred embodiment of the present invention.

Furthermore, the complementary HEMT 100a can serve as an inverter. FIG. 2 depicts an inverter formed by a complementary HEMT disclosed in the first preferred embodiment of the present invention, wherein elements which are substantially the same as those in the first preferred embodiment are denoted by the same reference numerals; an accompanying explanation is therefore omitted. As shown in FIG. 2, after the HEMT 100a is formed. A source voltage $V_{SS}$ is applied to the first source S1 of the N-type HEMT T1. A drain voltage $V_{DD}$ is applied to the second source S2 of the P-type HEMT T2. An output voltage $V_{out}$ is applied to the first drain D1 of the N-type HEMT T1 and the second drain D2 of the P-type HEMT T2. An input voltage $V_{in}$ is applied to the first gate G1 of the N-type HEMT T1 and the second gate G2 of the P-type HEMT T2. Now, an inverter 200a is completed.

Figure 3:
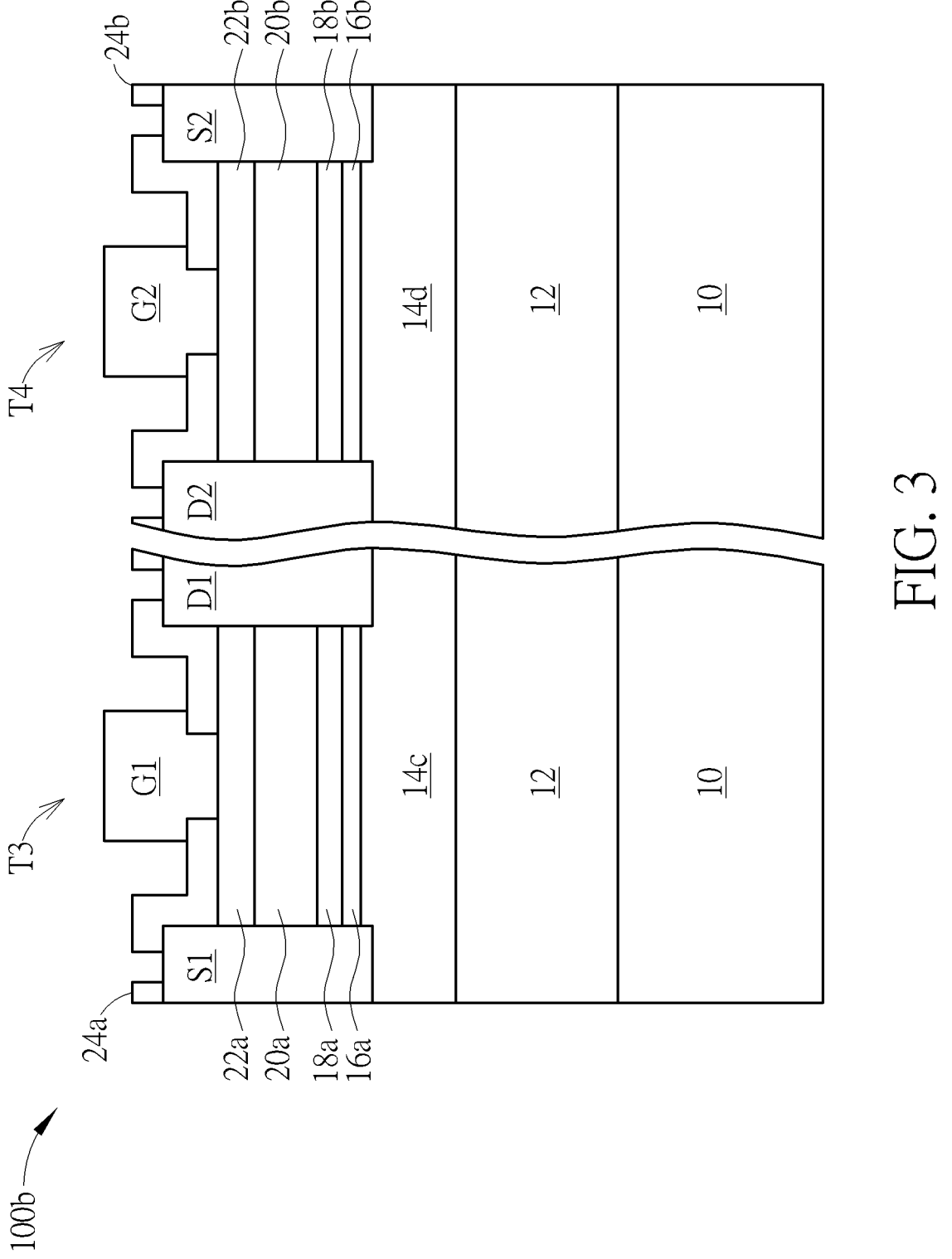
FIG. 3 depicts a complementary HEMT according to a second preferred embodiment of the present invention.

FIG. 3 depicts a complementary HEMT according to a second preferred embodiment of the present invention, wherein elements which are substantially the same as those in the first preferred embodiment are denoted by the same reference numerals; an accompanying explanation is therefore omitted.

Please refer to FIG. 1 and FIG. 3. In the second preferred embodiment of the present invention, the first undoped gallium nitride layer 14a within the N-type HEMT T1 is replaced by a P-type gallium nitride layer 14c in the N-type HEMT T3. The second undoped gallium nitride layer 14b within the P-type HEMT T2 is replaced by an N-type gallium nitride layer 14d of the P-type HEMT T4. Other elements are the same as those in the first preferred embodiment. The P-type gallium nitride layer 14c and the N-type gallium nitride layer 14d respectively control threshold voltages of the N-type HEMT T3 and the P-type HEMT T4. When a P-type dopant concentration in the P-type gallium nitride layer 14c is between E16 and E19 cm$^{-3}$, the N-type HEMT T3 is a normally-off transistor. When an N-type dopant concentration in the N-type gallium nitride layer 14d is between E16 and E19 cm$^{-3}$, the P-type HEMT T4 is a normally-off transistor. When a P-type dopant concentration in the P-type gallium nitride layer 14c is smaller than E16 cm$^{-3}$, the N-type HEMT T3 is a normally-on transistor. When an N-type dopant concentration in the N-type gallium nitride layer 14d is smaller than E16 cm$^{-3}$, the P-type HEMT T4 is a normally-on transistor. P-type dopants in the P-type gallium nitride layer 14c includes group II elements such as Mg, Ca, Sr. In this embodiment, the P-type dopants are preferably Mg. N-type dopants in the N-type dopant concentration in the N-type gallium nitride layer 14d includes group IV elements such as C, Si or Ge. In this embodiment, the N-type dopants are preferably Si. In the fabricating steps, the N-type gallium nitride layer 14d and the P-type gallium nitride layer 14c need to be formed in two steps. The fabricating steps of other elements are the same as those in the first preferred embodiment.

Figure 4:
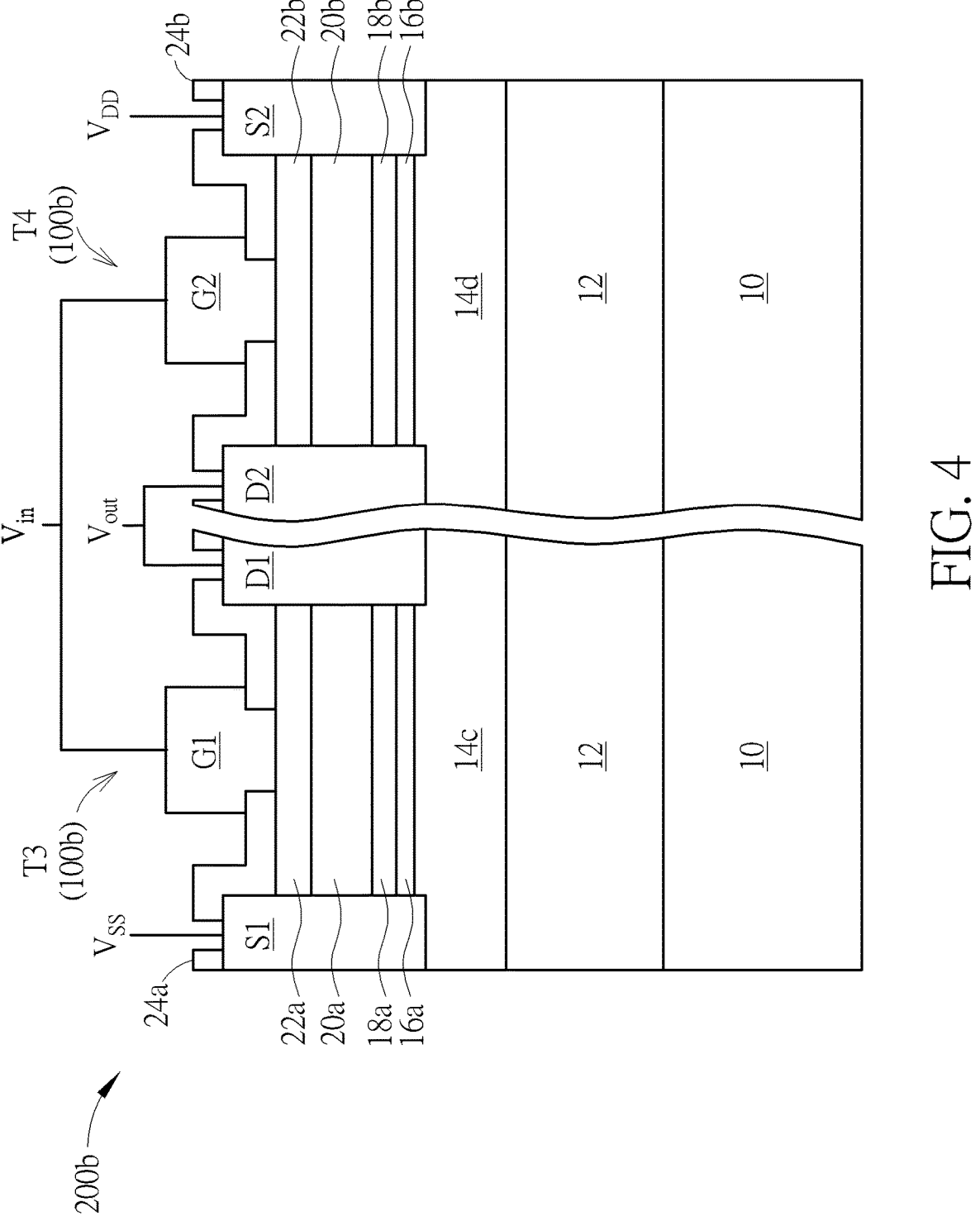
FIG. 4 depicts an inverter formed by a complementary HEMT disclosed in the second preferred embodiment of the present invention.

FIG. 4 depicts an inverter formed by a complementary HEMT disclosed in the second preferred embodiment of the present invention, wherein elements which are substantially the same as those in the second preferred embodiment are denoted by the same reference numerals; an accompanying explanation is therefore omitted. As shown in FIG. 4, after the HEMT 100b in FIG. 3 is formed, a source voltage $V_{SS}$ is applied to the first source S1 of the N-type HEMT T3. A drain voltage $V_{DD}$ is applied to the second source S2 of the P-type HEMT T4. An output voltage $V_{out}$ is applied to the first drain D1 of the N-type HEMT T3 and the second drain D2 of the P-type HEMT T4. An input voltage $V_{in}$ is applied to the first gate G1 of the N-type HEMT T3 and the second gate G2 of the P-type HEMT T4. Now, an inverter 200b is completed.

Novel complementary HEMTs are provided in the present invention. In the complementary HEMTs of the present invention, quantum confinement channels serve as carrier paths to reduce scattering and increase efficiency. Moreover, dopant concentrations in the first undoped gallium nitride layer, the second undoped gallium nitride layer, the P-type gallium nitride layer and the N-type gallium nitride layer are used to control threshold voltage of the complementary HEMTs. In this way, the HEMTs can be designed as normally-on transistors or normally-off transistors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A complementary high electron mobility transistor (HEMT), comprising:

a substrate;

an N-type HEMT disposed on the substrate, wherein the N-type HEMT is a first normally-on transistor, and the N-type HEMT comprises:

a first undoped gallium nitride layer, a first quantum confinement channel, a first undoped group III-V nitride compound layer and an N-type group III-V nitride compound layer disposed from bottom to top, wherein the first quantum confinement channel is a first material layer separate from the first undoped gallium nitride layer, and wherein the N-type group III-V nitride compound layer is an Al$_m$Ga$_{1-m}$N layer, and m≤1;

a first gate disposed on the N-type group III-V nitride compound layer; and a first source and a first drain disposed at two sides of the first gate;

a P-type HEMT disposed on the substrate, wherein the P-type HEMT is a second normally-on transistor, and the P-type HEMT comprises:

a second undoped gallium nitride layer, a second quantum confinement channel, a second undoped group III-V nitride compound layer, a P-type group III-V nitride compound layer, and a second group III-V nitride compound cap layer disposed from bottom to top, wherein the second quantum confinement channel is a second material layer separate from the second undoped gallium nitride layer, and P-type dopants of the P-type group III-V nitride compound layer are substantially absent from the second group III-V nitride compound cap layer, and wherein the P-type group III-V nitride compound layer is an $Al_nGa_{1-n}N$ layer, and $n \leq 1$;

a second gate disposed on the P-type group III-V nitride compound layer; and a second source and a second drain disposed at two sides of the second gate, wherein at the same depth from a top surface of the substrate, a molar fraction m of the N-type group III-V nitride compound layer and a molar fraction n of the P-type group III-V nitride compound layer are different from each other.

2. The complementary HEMT of claim 1, wherein the first quantum confinement channel and the second quantum confinement channel respectively comprise group III-V nitride compounds.

3. The complementary HEMT of claim 2, wherein the first quantum confinement channel and the second quantum confinement channel respectively comprise undoped $In_xGa_{1-x}N$, and $x \leq 1$.

4. The complementary HEMT of claim 1, wherein the first undoped group III-V nitride compound layer and the second undoped group III-V nitride compound layer respectively comprise undoped $Al_yGa_{1-y}N$, and $y \leq 1$.

5. The complementary HEMT of claim 1, further comprising a first III-V nitride compound cap layer disposed on the N-type group III-V nitride compound layer.

6. The complementary HEMT of claim 1, wherein dopants in the N-type group III-V nitride compound layer comprise group IV elements, and dopants in the P-type group III-V nitride compound layer comprise group II elements.

7. A complementary high electron mobility transistor (HEMT), comprising:

a substrate;

an N-type HEMT disposed on the substrate, wherein the N-type HEMT comprises:

a P-type gallium nitride layer, a first quantum confinement channel, a first undoped group III-V nitride compound layer and an N-type group III-V nitride compound layer disposed from bottom to top, wherein the first quantum confinement channel is a first material layer separate from the P-type gallium nitride layer, and wherein the N-type group III-V nitride compound layer is an $Al_mGa_{1-m}N$ layer, and $m \leq 1$;

a first gate disposed on the N-type group III-V nitride compound layer; and a first source and a first drain disposed at two sides of the first gate;

a P-type HEMT disposed on the substrate, wherein the P-type HEMT comprises:

an N-type gallium nitride layer, a second quantum confinement channel, a second undoped group III-V nitride compound layer, a P-type group III-V nitride compound layer, and a second group III-V nitride compound cap layer disposed from bottom to top, wherein the second quantum confinement channel is a second material layer separate from the N-type gallium nitride layer, and P-type dopants of the P-type group III-V nitride compound layer are substantially absent from the second group III-V nitride compound cap layer, and wherein the P-type group III-V nitride compound layer is an $Al_nG_{1-n}N$ layer, and $n \leq 1$;

a second gate disposed on the P-type group III-V nitride compound layer; and a second source and a second drain disposed at two sides of the second gate, wherein at the same depth from a top surface of the substrate, a molar fraction m of the N-type group III-V nitride compound layer and a molar fraction n of the P-type group III-V nitride compound layer are different from each other.

8. The complementary HEMT of claim 7, wherein when a P-type dopant concentration in the P-type gallium nitride layer is between E16 and E19 $cm^{-3}$, the N-type HEMT is a normally-off transistor.

9. The complementary HEMT of claim 7, when a P-type dopant concentration in the P-type gallium nitride layer is smaller than E16 $cm^{-3}$, the N-type HEMT is a normally-on transistor.

10. The complementary HEMT of claim 7, wherein when an N-type dopant concentration in the N-type gallium nitride layer is between E16 and E19 $cm^{-3}$, the P-type HEMT is a normally-off transistor.

11. The complementary HEMT of claim 7, when an N-type dopant concentration in the N-type gallium nitride layer is smaller than E16 $cm^{-3}$, the P-type HEMT is a normally-on transistor.

12. The complementary HEMT of claim 7, wherein the first quantum confinement channel and the second quantum confinement channel respectively comprise undoped $In_xGa_{1-x}N$, and $x \leq 1$.

13. The complementary HEMT of claim 7, wherein the first undoped group III-V nitride compound layer and the second undoped group III-V nitride compound layer respectively comprise undoped $Al_yGa_{1-y}N$, and $y \leq 1$.

14. The complementary HEMT of claim 7, further comprising a first III-V nitride compound cap layer disposed on the N-type group III-V nitride compound layer.

15. The complementary HEMT of claim 7, wherein dopants in the N-type group III-V nitride compound layer comprise group IV elements, and dopants in the P-type group III-V nitride compound layer comprise group II elements.

* * * * *